(12) United States Patent
Chung et al.

(10) Patent No.: US 12,163,242 B2
(45) Date of Patent: Dec. 10, 2024

(54) METHOD OF MANUFACTURING COLORFUL THERMAL INSULATION FILM

(71) Applicant: NATIONAL CHENG KUNG UNIVERSITY, Tainan (TW)

(72) Inventors: Chen-Kuei Chung, Tainan (TW); Chung-Yu Yu, Tainan (TW); Tsung-Han Chen, Tainan (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 18/178,825

(22) Filed: Mar. 6, 2023

(65) Prior Publication Data

US 2024/0301580 A1    Sep. 12, 2024

(51) Int. Cl.

| | | |
|---|---|---|
| C23C 28/00 | (2006.01) | |
| C23C 14/18 | (2006.01) | |
| C23C 14/20 | (2006.01) | |
| C23C 14/24 | (2006.01) | |
| C23C 14/34 | (2006.01) | |
| C25D 5/54 | (2006.01) | |
| C25D 5/56 | (2006.01) | |
| C25D 11/04 | (2006.01) | |
| C25D 11/14 | (2006.01) | |
| C25D 11/16 | (2006.01) | |

(Continued)

(52) U.S. Cl.
CPC ............ *C25D 11/14* (2013.01); *C23C 14/18* (2013.01); *C23C 14/185* (2013.01); *C23C 14/20* (2013.01); *C23C 14/205* (2013.01); *C23C 14/24* (2013.01); *C23C 14/34* (2013.01); *C23C 28/32* (2013.01); *C23C 28/345* (2013.01); *C25D 11/045* (2013.01); *C25D 11/16* (2013.01); *C25D 11/24* (2013.01)

(58) Field of Classification Search
CPC .......... C23C 28/345; C25D 5/54; C25D 5/56; C25D 11/18; C25D 11/04; C25D 11/24
USPC ........ 205/162, 165, 199, 229, 189, 190, 164
See application file for complete search history.

(56) References Cited

U.S. PATENT DOCUMENTS

| | | | | |
|---|---|---|---|---|
| 3,971,710 A | * | 7/1976 | Romankiw | ....... H01L 21/02194 257/E21.291 |
| 4,022,671 A | * | 5/1977 | Asada | .................... C25D 11/22 205/174 |
| 2007/0116934 A1 | * | 5/2007 | Miller | ...................... G02B 1/11 428/172 |

FOREIGN PATENT DOCUMENTS

| | | | | |
|---|---|---|---|---|
| CN | 109473565 A | * | 3/2019 | ........... C09D 133/06 |
| CN | 210362764 U | | 4/2020 | |

(Continued)

*Primary Examiner* — Edna Wong
(74) *Attorney, Agent, or Firm* — Rosenberg, Klein & Lee

(57) ABSTRACT

A method of manufacturing colorful thermal insulation films is provided. A substrate is connected with a metal adhesion layer and then the metal adhesion layer is connected with a porous anodic aluminum oxide (AAO) layer. A porosity of the AAO layer is changed by pore-widening. Thereby the thermal insulation film produced shows the color by the structure color of the AAO layer. Thus no dyes and organic compounds are required to be added during manufacturing process and environmental pollution caused by these substances can be avoided. The pore-widening changes the porosity of the AAO layer and further provides convenient color adjustment so that the colorful thermal insulation film with different colors can be produced easily. Besides providing attractive appearance, the colorful thermal insulation film filters out light with specific wavelengths.

14 Claims, 8 Drawing Sheets

(51) Int. Cl.
*C25D 11/18* (2006.01)
*C25D 11/24* (2006.01)

(56) References Cited

FOREIGN PATENT DOCUMENTS

| GB | 1580994 A | * | 12/1980 | ............ C25D 11/22 |
| JP | 2018171726 A | * | 11/2018 | ............ B32B 15/08 |
| JP | 2023020769 A | * | 2/2023 | .............. B41C 1/10 |
| TW | 200934893 A | | 8/2009 | |
| WO | WO-2018141832 A1 | * | 8/2018 | ........... C09D 133/06 |
| WO | WO-2022134860 A1 | * | 6/2022 | ............... H03H 9/17 |

* cited by examiner

METHOD OF MANUFACTURING COLORFUL THERMAL INSULATION FILM

BACKGROUND OF THE INVENTION

Field of the Invention

The present invention relates to a thermal insulation device, especially to a method of manufacturing colorful thermal insulation films.

Description of Related Art

Cars are favored than other forms of transportation nowadays. All vehicles now are required to be affordable, safe, comfortable, and attractive. Along with consumers who pay more attention to issues including energy, environmental protection, etc., energy-saving devices for cars are of growing importance.

Thermal insulation films which block sunlight and reduce air-conditioning needs in cars are one of the main energy-saving devices for cars. The colorful thermal insulation films are divided into inorganic colorful insulation films and organic colorful insulation films. In the inorganic colorful thermal insulation film, color is generated by dissolving inorganic compounds such as metal ions in glass to form stained glass and then attaching thermal insulation films on surface of the stained glass. Thus the inorganic colorful thermal insulation film is not easy to fade and durable to light. Yet its color is limited to a single color, and unable to be adjusted. Thus the inorganic colorful thermal insulation film is hard to be applied to absorption of light with specific colors (wavelengths). As to the organic colorful thermal insulation film, organic dyes is used to dye polymer plastic films and get the thermal insulation films. Although the organic thermal insulation film provides a plurality of colors, its service life is short due to the organic dyes used which are not resistant to light and high temperature. During manufacturing process of both the organic and inorganic colorful thermal insulation films, toxins, heavy metals, strong acids, and volatile solvents generated are all environmental pollutants.

Thereby some people in the field prepare the thermal insulation films or plates by anodization of aluminum. Please refer to Taiwanese Pat. Pub, No. 200934893A, a method of manufacturing large-area thermal insulation films by using nanotube properties of anodic aluminum oxide films is revealed. A substrate made of pure aluminum or aluminum alloy is provided. A regularly-arranged aluminum oxide nanotube is formed on the substrate. Then a layer of nickel is coated in the nanotube for reducing radiation heat transfer. After vacuuming, an opening of the nanotube is covered by a dense aluminum oxide film to make an inner space of the nanotube a vacuum for reducing heat transfer by conduction and convection. Refer to Chinese Pat. No. 210362764U, an anodized aluminum oxide plate is revealed. The anodized aluminum oxide plate includes a first aluminum oxide plate and a second aluminum oxide plate. An insertion slot is mounted on a middle part of an outer side of the first aluminum oxide plate while a left end of the first aluminum oxide plate is fixed and connected with a thermal insulation layer whose left side is fixed and connected with a reflective layer. A right side of the first aluminum oxide plate is fixed and connected with a honeycomb panel whose side wall is provided with round holes. A right side of the honeycomb panel is fixed and connected with the second aluminum oxide plate. An insertion bar is fixed and connected with a middle part of an outer side of the second aluminum oxide plate while a connection tube is inserted through the outer side of the second aluminum oxide plate.

Although the thermal insulation film in the Taiwanese Pat. Pub. No. 200934893A and the anodized aluminum oxide plate in the Chinese Pat. No. 210362764U provide thermal insulation function, their manufacturing processes are quite complicated and their structures are complex. Thus the production cost is relatively high, unable to meet requirements of low cost and high productivity in modern industry. Moreover, the thermal insulation film and the anodized aluminum oxide plate can't filter out light with specific wavelength such as blue light, ultraviolet light, etc. effectively. Thus they are lack of practical benefits while in use.

U.S. Pat. No. 10,295,872 B2 "Display substrate, display device and manufacturing method the same" is a display device comprising a porous anodic aluminum oxide film, a first electrode layer and a second electrode layer respectively disposed on both sides of the porous anodic aluminum oxide film, which is used to display the color from the quantum dots between the two electrode layers and can be excited to emit different colors of light. The anodic oxidation method is used to form a porous anodized aluminum film for high thermal stability and insulating, so that each pore passage is filled with quantum dots, however, it does not propose any color characteristics produced by the color of the anodic aluminum oxide layer, and it is also impossible to effectively filter out specific wavelengths of light such as blue light or ultraviolet light.

Furthermore, please refer to U.S. Patent Pub. No. 20210302834A1 titled "Lithographic printing plate precursor and method of use". It discloses IR-sensitive lithographic printing plate precursors which provide a stable print-out image using a unique IR radiation-sensitive composition. This IR radiation-sensitive composition includes: free radically polymerizable component; an IR radiation absorber; an initiator composition; a borate compound; and a compound capable of forming a colored boronic complex during or after exposure of the infrared radiation-sensitive image-recording layer to infrared radiation. The resulting print-out image exhibits an excellent color contrast between the exposed and non-exposed regions. However, the IR radiation-sensitive composition in this application uses various organic substances, which not only increases the production cost, but also produces toxic substances during the production process to cause serious pollution to the environment.

Thus there is room for improvement and there is a need to provide a novel colorful thermal insulation films which overcome the shortcomings mentioned above during manufacturing and use.

SUMMARY OF THE INVENTION

It is a primary object of the present invention to provide a method of manufacturing colorful thermal insulation films by which no environmental pollution is caused and thermal insulation films produced have good mechanical properties. Moreover, easy color adjustment of the thermal insulation film is achieved for enhancing aesthetics, light filtering, and heat blocking.

In order to achieve the above objects, a method of manufacturing colorful thermal insulation films according to the present invention includes the following steps.

A. preparing a substrate;

B: coating an adhesion layer: then coating a metal adhesion layer on the substrate;

C: coating aluminum: coating a layer of aluminum-containing material over the metal adhesion layer;

D: anodizing: placing the substrate in an acidic solution and applying a voltage to perform anodizing until the aluminum-containing material is completely converted into a porous anodic aluminum oxide (AAO) layer;

E: carrying out pore-widening: then placing the substrate in phosphoric acid to carry out pore-widening for changing porosity of the AAO layer.

Preferably, the AAO layer is further connected with a metal thermal insulation layer.

Preferably, the metal thermal insulation layer is an aluminum-containing layer.

Preferably, a thickness of the metal thermal insulation layer is 1-40 nm.

Preferably, the substrate is a transparent glass substrate.

Preferably, the substrate is a transparent polyethylene terephthalate (PET) substrate.

Preferably, the metal adhesion layer is a titanium layer.

Preferably, the metal adhesion layer is a chromium layer.

Preferably, a thickness of the metal adhesion layer is 10-50 nm.

Preferably, a thickness of the layer of aluminum-containing material coated over the metal adhesion layer is 100-400 nm.

Preferably, the step of placing the substrate in phosphoric acid to carry out pore-widening takes 1-20 minutes.

Preferably, the acidic solution can be oxalic acid, phosphoric acid, or sulfuric acid.

Preferably, the substrate is placed in a 0.1-1.2 molar concentration of acidic solution at 25° C. to carry out anodizing at a voltage ranging from 20 to 120.

Preferably, the substrate is placed in a 0.1-20 weight percent acidic solution at 25° C. to carry out anodizing at a voltage ranging from 20 to 200.

Preferably, the substrate is placed in a 0.1-20 weight percent phosphoric acid at 10-45° C. to carry out pore-widening.

Preferably, the metal adhesion layer is deposited on the substrate by sputtering.

Preferably, the metal adhesion layer is deposited on the substrate by thermal evaporation.

The thermal insulation film produced by the present method shows the color by the structure color of the AAO layer so that no dyes and organic compounds are added during manufacturing process. Thus environmental pollution caused by these substances can be avoided. The color adjustment of the thermal insulation film is convenient due to change of porosity of the AAO layer by pore-widening. Thus the colorful thermal insulation film with different colors can be produced easily. The colorful thermal insulation films not only have attractive appearance but also filter out light with specific wavelengths and thus become more practical. Moreover, the AAO layer is further connected with a metal insulation layer. Thereby optical properties of the colorful thermal insulation film such as reflectance and transmittance are improved effectively and efficient thermal insulation is achieved because that strong light and heat energy are blocked efficiently.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

In order to learn technical content, purposes and functions of the present invention more clearly and completely, please refer to the following detailed descriptions with the figures and reference signs.

Figure 1:
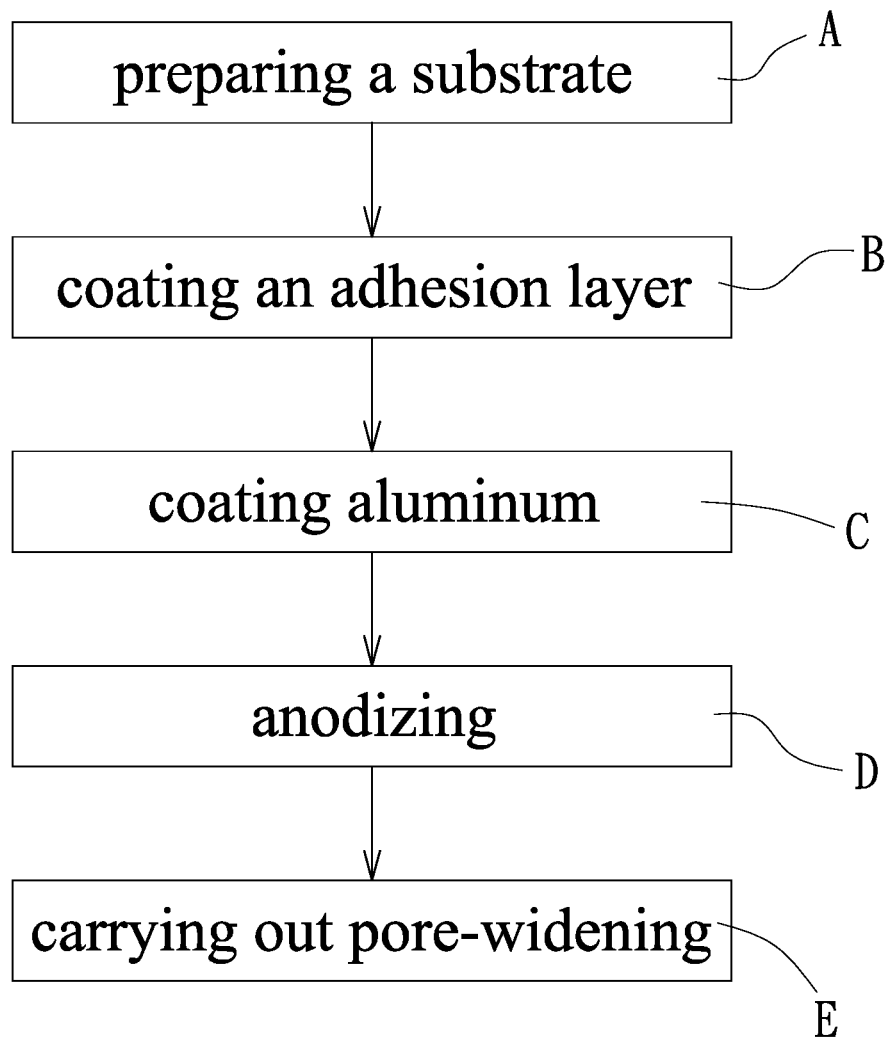
FIG. 1 is a flow chart showing steps of an embodiment according to the present invention.
Figure 2:
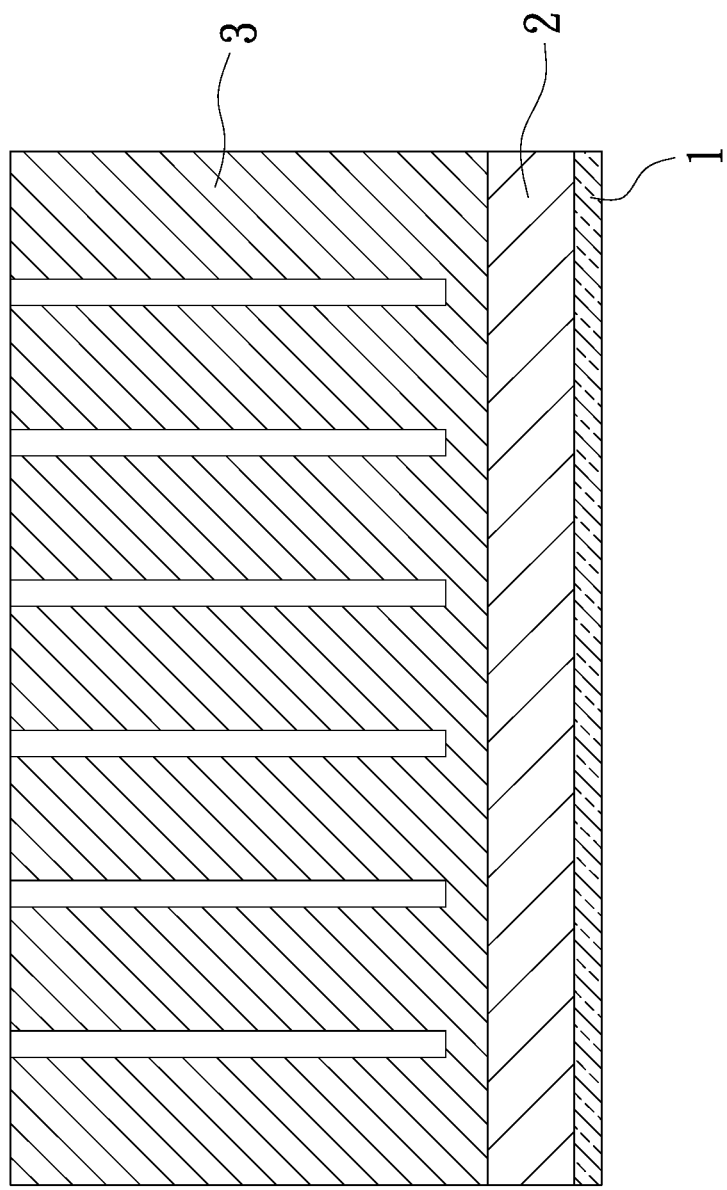
FIG. 2 is a sectional view of an embodiment according to the present invention.

Refer to FIG. 1 and FIG. 2, a method of manufacturing colorful thermal insulation films according to the present invention includes the steps of:

A: preparing a substrate: preparing a substrate 1 which is a transparent glass;

B: coating an adhesion layer; a metal adhesion layer 2 with a thickness of 10-50 nanometer (nm) is deposited on the substrate 1 by sputtering. The metal adhesion layer 2 can be a titanium layer, a chromium layer, etc.;

C: coating aluminum: coating a layer of aluminum-containing material with a thickness of 100-400 nm over the metal adhesion layer 2 by sputtering;

D: anodizing: placing the substrate 1 in a 0.1-1.2 molar concentration of acidic solution at 25° C. and carrying out anodizing at a voltage ranging from 20 to 120 (20-120 V) until the aluminum-containing material is completely converted into a porous anodic aluminum oxide (AAO) layer 3. The acidic solution can be oxalic acid, phosphoric acid, sulfuric acid, and so forth;

E: carrying out pore-widening: then placing the substrate 1 in a 0.1-20 weight percent (wt %) phosphoric acid at 10-45° C. for about 1-20 minutes to carry out pore-widening for changing porosity of the AAO layer 3.

Figure 3:
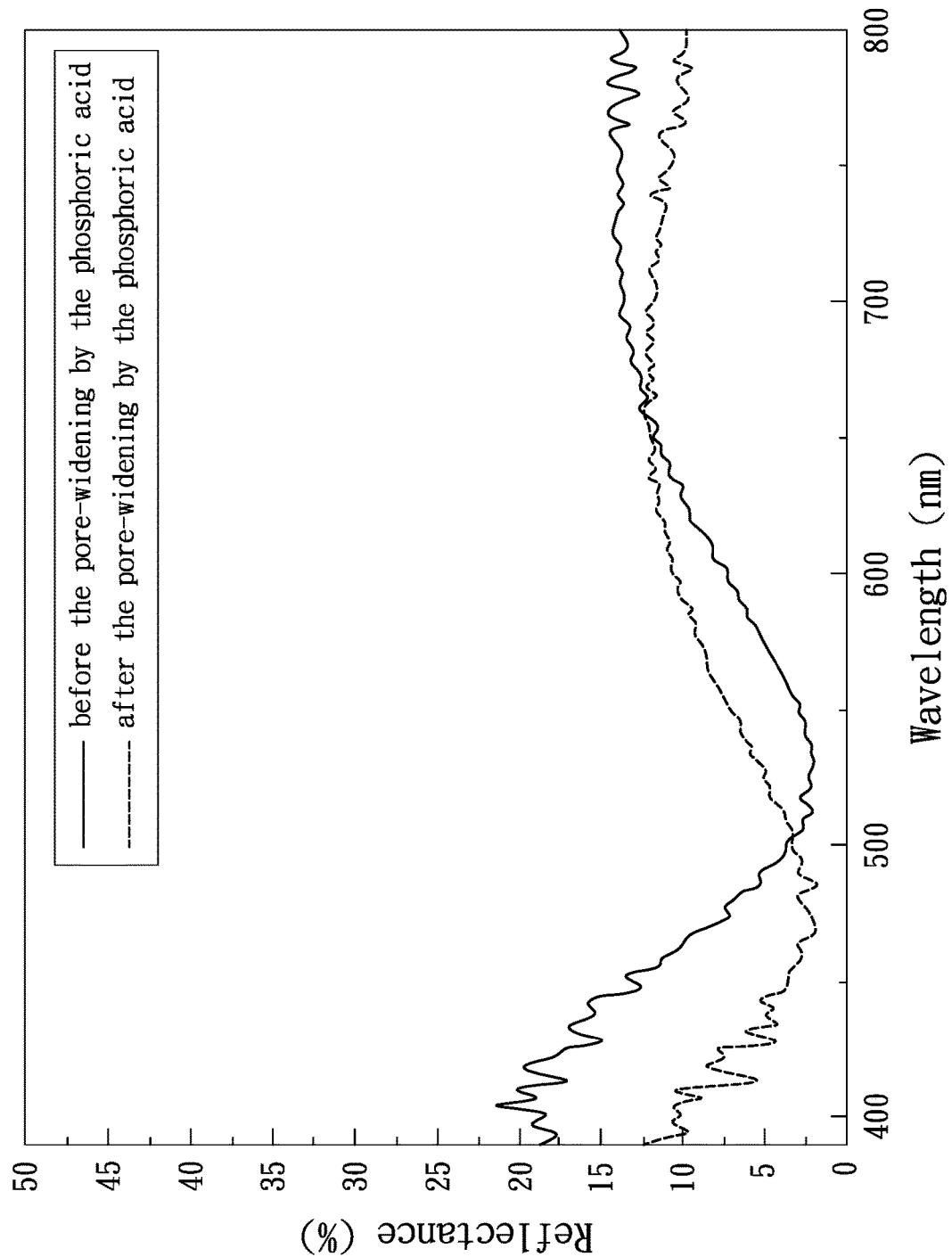
FIG. 3 shows reflectance spectra of an embodiment before and after pore-widening according to the present invention.
Figure 4:
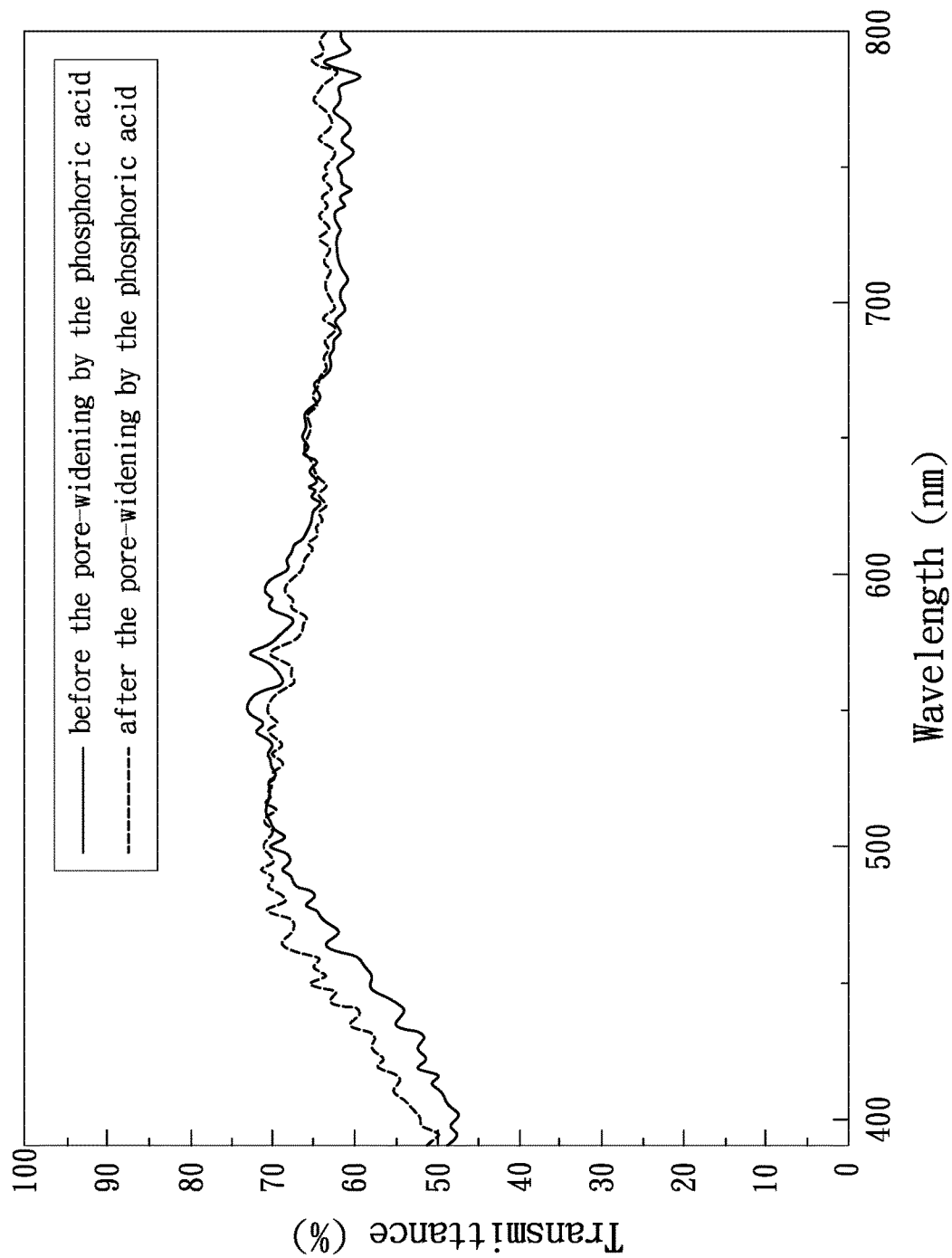
FIG. 4 shows transmittance spectra of an embodiment before and after pore-widening according to the present invention.

Thereby the porosity of the AAO layer 3 is changed by the pore-widening step to obtain colorful thermal insulation films with different colors easily and conveniently. As to the color of an object, it depends on the reflectance properties of the surface of the object. Refer to FIG. 3, spectral reflectance curves are revealed. Before the pore-widening by the phosphoric acid, the spectral reflectance curve of the present colorful thermal insulation film has a peak at about 750 nm and the colorful thermal insulation film shows red color. After the pore-widening by the phosphoric acid, the peak of the reflectance is at about 600 nm which shows yellow color. According to the above spectral reflectance curve, the colorful thermal insulation films do show colors without adding any dyes. The color adjustment is achieved by the pore-widening. Since the transmittance is an important index of thermal insulation, please refer to FIG. 4. No thermal insulation effect is provided when the transmittance is 100%.

Yet the present method reduces the transmittance into 50-70%. This means the colorful thermal insulation film produced provides good thermal insulation o Moreover, the present colorful thermal insulation film shows colors by the structure color of the AAO layer 3 and the color shown is adjusted by the step of pore-widening. Thus no dyes and complicated organic materials are used during manufacturing process and environmental pollution caused by toxic compounds, heavy metals, strong acids, evaporative solvents etc. can be avoided. The AAO layer 3 of the present colorful thermal insulation film is made pf ceramic material which features on high temperature resistance, light resistance, stable physicochemical properties, no fading, etc. A specific color is selected by the way of the pore-widening of the porous AAO layer 3 during manufacturing so that filtering of light rays with specific wavelengths such as blue light and ultraviolet light can be enhanced. Besides aesthetic purpose, the present method is practical. Moreover, color intensity of the present colorful thermal insulation film is determined by ambient light sources. The colorful thermal insulation film shows quite light color while in dim light at night so that the driver's visibility will not be affected by the present colorful thermal insulation film and night driving safety is improved.

Figure 5:
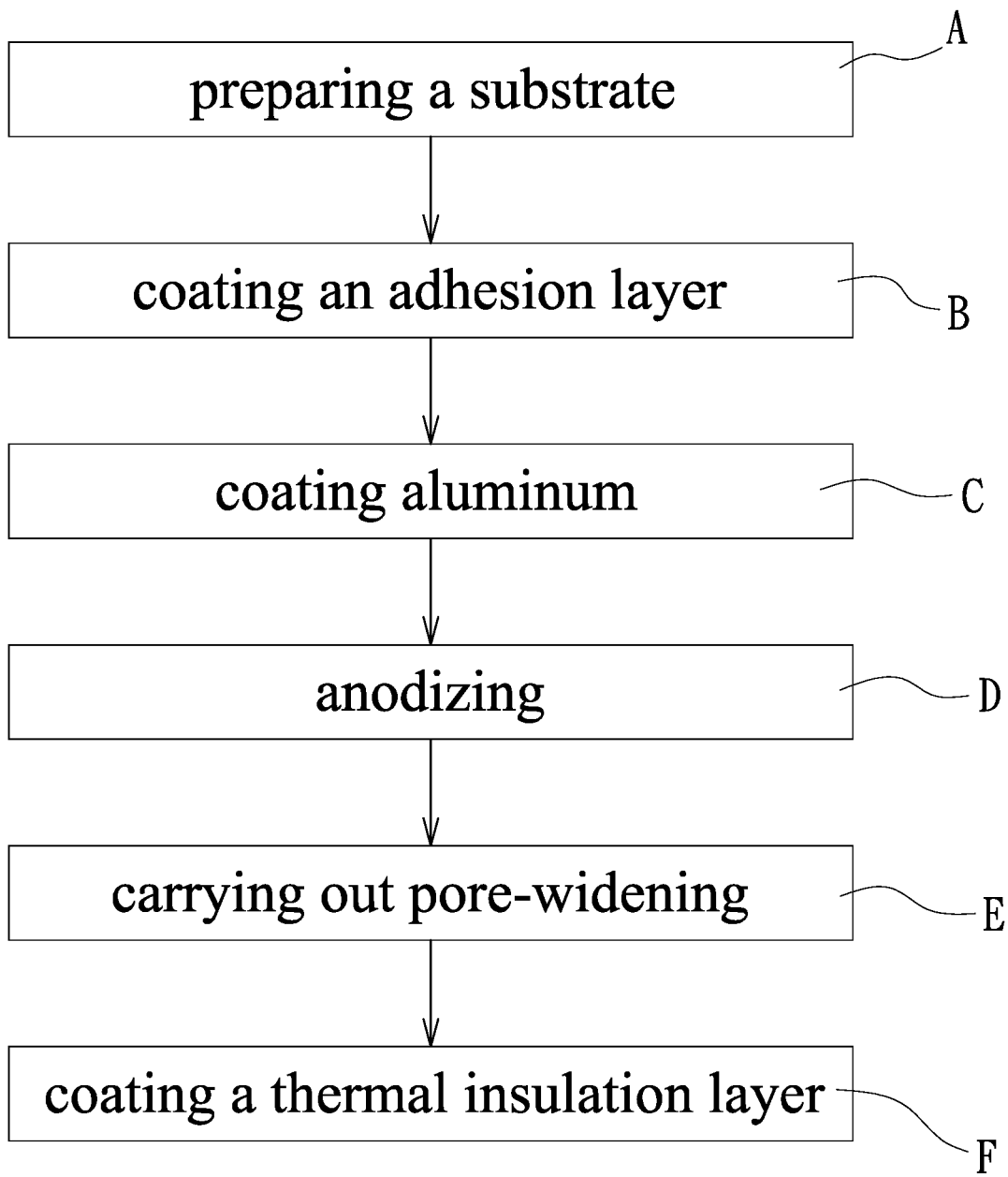
FIG. 5 is a flow chart showing steps of another embodiment according to the present invention.
Figure 6:
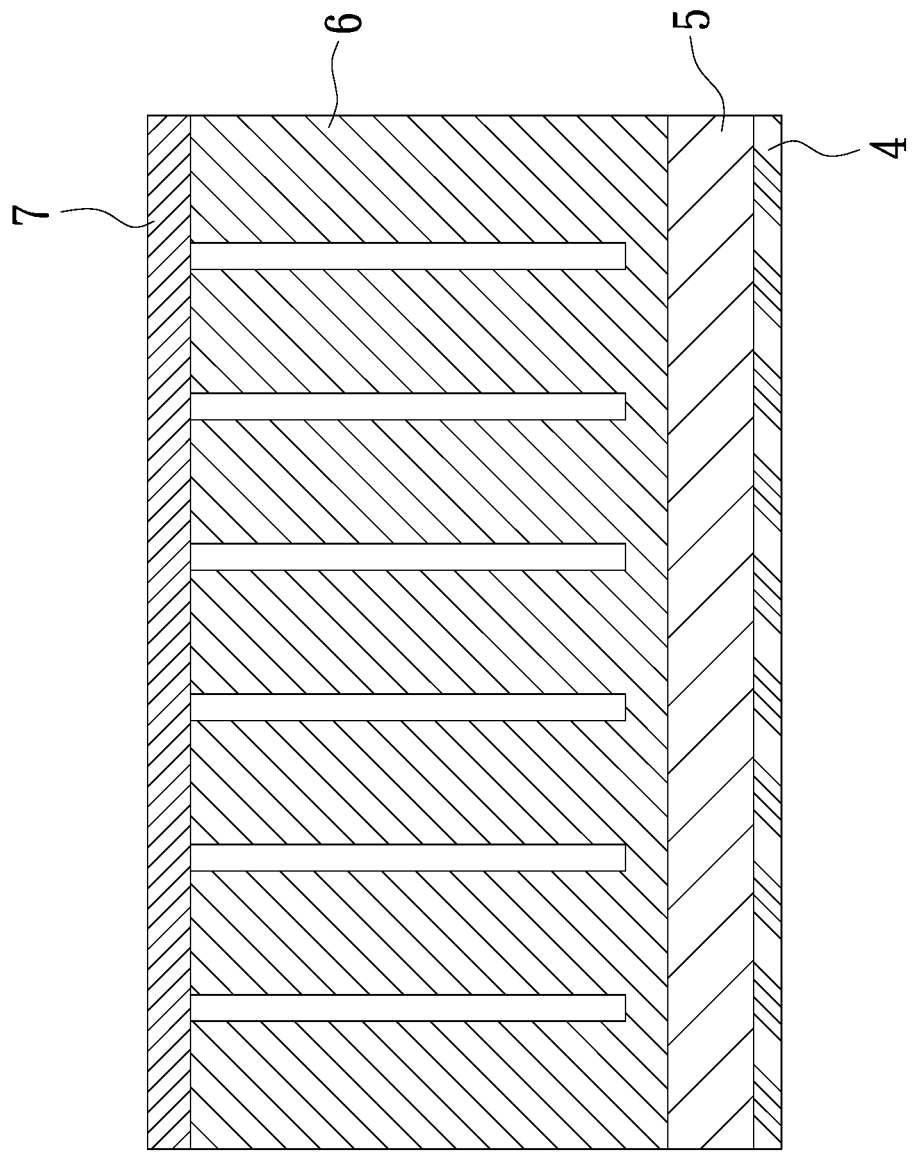
FIG. 6 is a sectional view of another embodiment according to the present invention.

Refer to FIG. 5 and FIG. 6, another embodiment of a method of manufacturing colorful thermal insulation films is revealed. The method of manufacturing colorful thermal insulation films according to the present invention includes the following steps.

- A: preparing a substrate: preparing a substrate 4 which is made of transparent polyethylene terephthalate (PET);
- B: coating an adhesion layer; a metal adhesion layer 5 with a thickness of 10-50 nm is deposited on the substrate 4 by thermal evaporation. The metal adhesion layer 5 can be a titanium layer, a chromium layer, etc.;
- C: coating aluminum: coating a layer of aluminum-containing material with a thickness of 100-400 nm over the metal adhesion layer 5 by sputtering;
- D: anodizing: placing the substrate 4 in a 0.1-20 weight percent (wt %) acidic solution at 25° C. and carrying out anodizing at a voltage ranging from 20 to 200 (20-200V) until the aluminum-containing material is completely converted into a porous anodic aluminum oxide (AAO) layer 6. The acidic solution can be oxalic acid, phosphoric acid, sulfuric acid, and so forth.
- E. carrying out pore-widening: then placing the substrate 4 in a 0.1-20 weight percent (wt %) phosphoric acid at 10-45° C. for about 1-20 minutes to carry out pore-widening for changing porosity of the AAO layer 6.
- F: coating a thermal insulation layer; coating a metal thermal insulation layer 7 with a thickness of 1-40 nm over the AAO layer 6 by sputtering. The metal thermal insulation layer 7 is an aluminum-containing layer.

Figure 7:
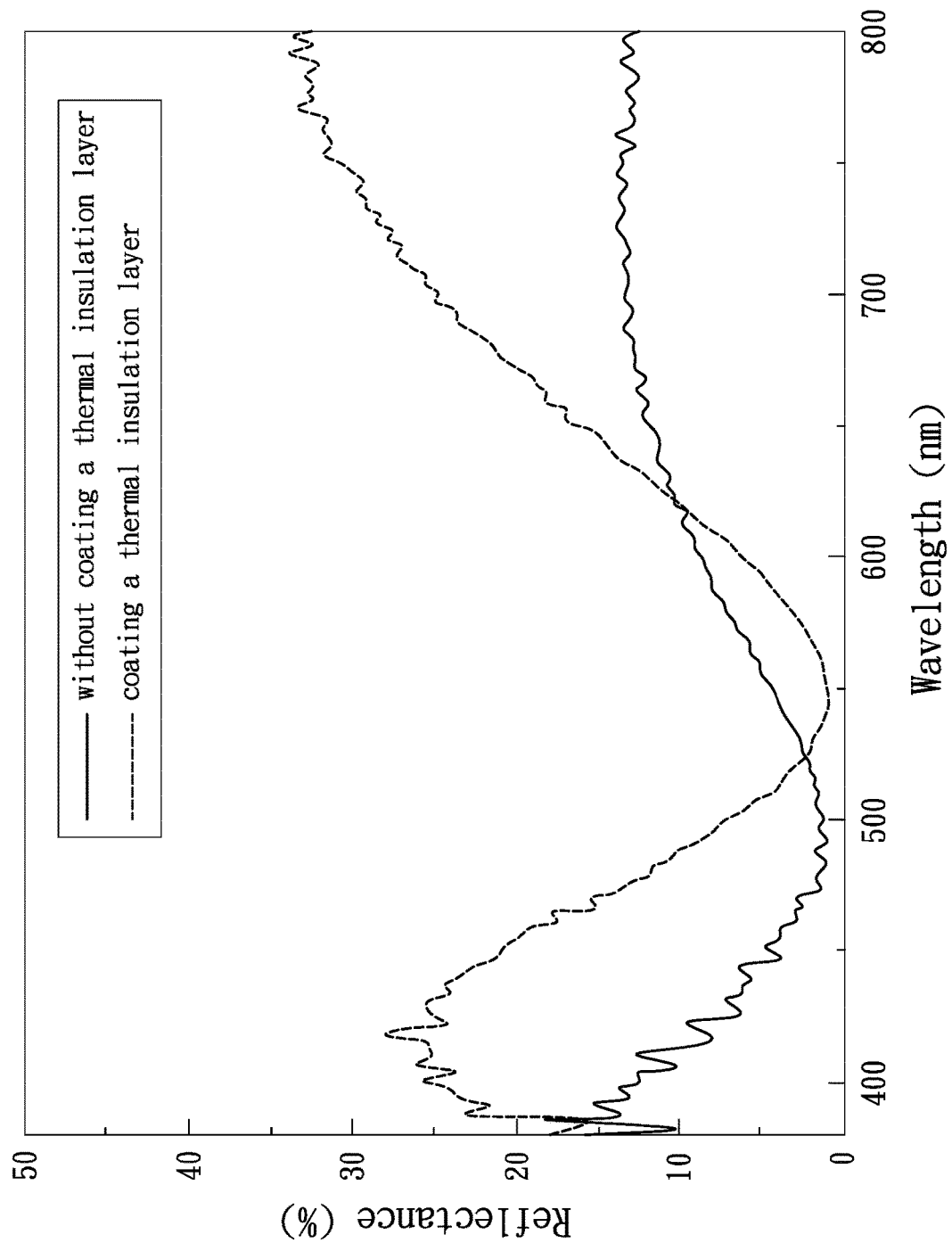
FIG. 7 shows reflectance spectra of an embodiment before and after coating of a metal thermal insulation layer according to the present invention.
Figure 8:
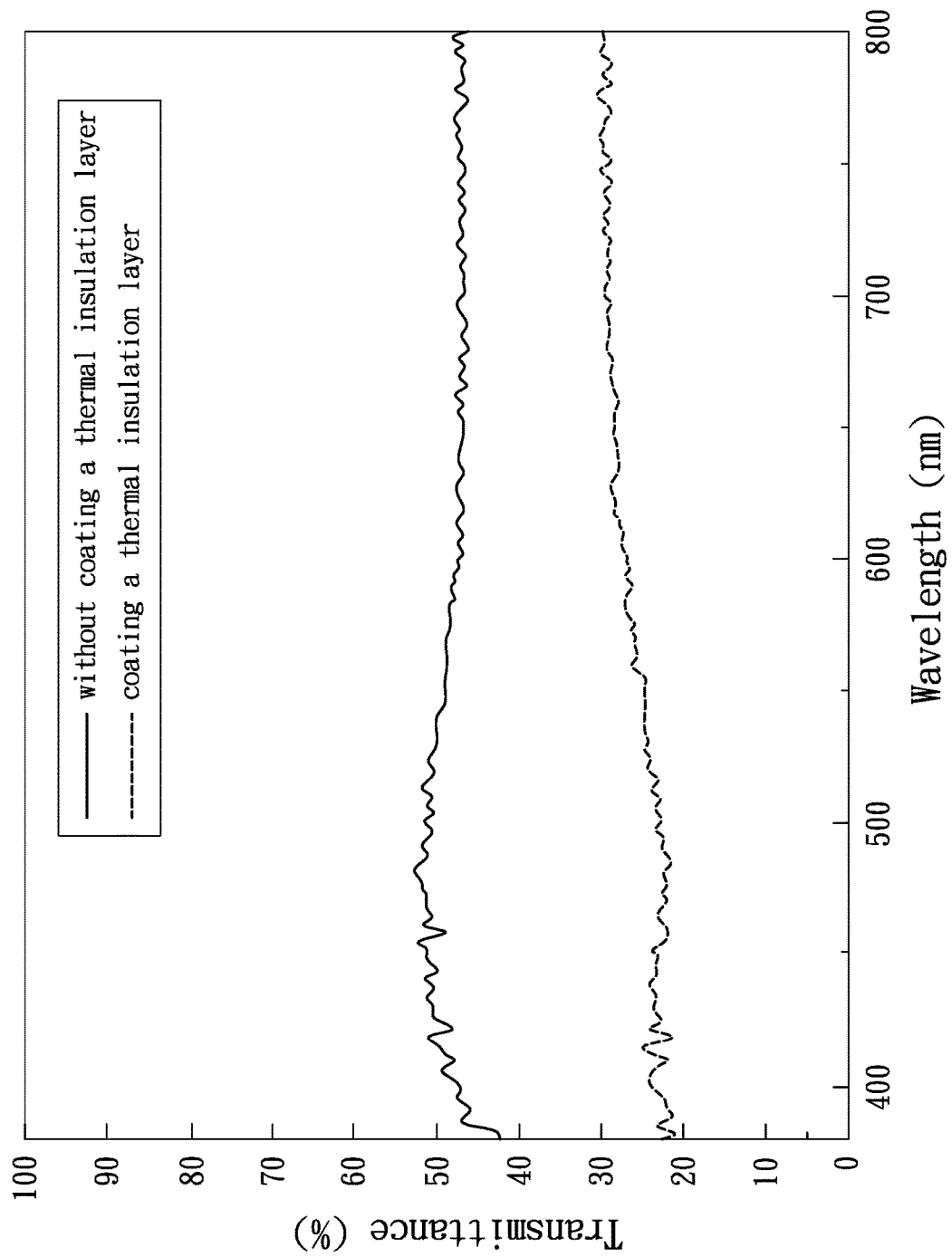
FIG. 8 shows transmittance spectra of an embodiment before and after coating of a metal thermal insulation layer according to the present invention.

Refer to FIG. 7 and FIG. 8, reflectance spectra and transmittance spectra are revealed. After the sputtering of the metal thermal insulation layer 7, both the reflectance and the transmittance show a significant change. Especially after the sputtering of the metal thermal insulation layer 7, the light transmittance is dramatically reduced to 20% and the thermal insulation performance is improved significantly. Thereby optical properties of the present colorful thermal insulation film such as reflectance and transmittance are improved effectively due to design of the AAO layer 6 connected with the metal thermal insulation layer 7. Therefore, efficient thermal insulation is achieved because that both strong light and heat energy are blocked efficiently.

The present colorful thermal insulation film can be applied to automotive window glass, architectural window glass, and screens of consumer electronics such as mobile phones, computers, etc. The colorful thermal insulation film is used for reducing heat that penetrate the automotive windows as well as reducing transmission of light and temperature inside the car to enhance vehicle comfort and aesthetic appeal of car windows. While being applied to the architectural window, the thermal insulation film not only blocks the light and reduces indoor temperature, but also filters out light with specific colors to give natural and soft light. The colorful thermal insulation film can also be used as screen protector which filters out blue light for protection of user's eyes.

In summary, the colorful thermal insulation film according to the present invention has the following advantage.

1. The thermal insulation film produced by the present method shows the color by the structure color of the AAO layer. Thus no dyes, complicated organic compounds, etc. are required to be added during the manufacturing process. Therefore, environmental pollution caused by these substances during the manufacturing process can be avoided effectively.
2. The AAO layer formed by the present method is a kind of ceramic material which features on high temperature resistance, light resistance, stable physicochemical properties, no fading, etc. Thereby service life of the colorful thermal insulation film is increased effectively.
3. In the present method, the step of pore-widening changes the porosity of the AAO layer and further provides color adjustment. Thereby specific colors can be selected during the manufacturing of the colorful thermal insulation film to enhance filtering of light with specific wavelengths such as blue light, ultraviolet light, etc. Besides the attractive appearance, the thermal insulation film produced is also practical.
4. The metal thermal insulation layer is disposed over and connected with the AAO layer by the present method so that optical properties such as such as reflectance and transmittance are improved effectively. Thereby efficient thermal insulation is achieved because that both strong light and heat energy are blocked efficiently.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

What is claimed is:

1. A method of manufacturing a colorful thermal insulation film, comprising:
   - A: preparing a substrate formed by one of a transparent glass material or a transparent polyethylene terephthalate (PET) material;
   - B: coating a metal adhesion layer on the substrate;
   - C: coating a layer of aluminum-containing material over the metal adhesion layer;
   - D: anodizing by placing the substrate coated with the metal adhesion layer and the layer of aluminum-containing material coated over the metal adhesion layer in an acidic solution and applying a voltage thereto until the layer of aluminum-containing material is completely converted into a porous anodic aluminum oxide (AAO) layer;
   - E: pore-widening by placing the anodized substrate coated with the metal adhesion layer and the layer of aluminum-containing material coated over the metal adhesion layer in phosphoric acid for changing a porosity of the AAO layer to adjust a perceived color of light reflected therefrom;

F: coating and connecting the AAO layer with changed porosity with a metal thermal insulation layer to form the colorful thermal insulation film; and G: applying the colorful thermal insulation film to one of a window or a viewing screen, and wherein the applied colorful thermal insulation film has a rate of light transmittance of 20-30% over a wavelength range of 400-800 nm.

2. The method as claimed in claim 1, wherein the metal thermal insulation layer is an aluminum-containing layer.

3. The method as claimed in claim 1, wherein a thickness of the metal thermal insulation layer is 1-40 nm.

4. The method as claimed in claim 1, wherein the metal adhesion layer is a titanium layer.

5. The method as claimed in claim 1, wherein the metal adhesion layer is a chromium layer.

6. The method as claimed in claim 1, wherein a thickness of the metal adhesion layer is 10-50 nm.

7. The method as claimed in claim 1, wherein a thickness of the layer of aluminum-containing material coated over the metal adhesion layer is 100-400 nm.

8. The method as claimed in claim 1, wherein pore-widening includes placing the anodized substrate coated with the metal adhesion layer and the layer of aluminum-containing material coated over the metal adhesion layer in phosphoric acid for a time period of 1-20 minutes.

9. The method as claimed in claim 1, wherein the acidic solution is selected from the group consisting of oxalic acid, phosphoric acid, and sulfuric acid.

10. The method as claimed in claim 1, wherein anodizing includes placing the substrate coated with the metal adhesion layer and the layer of aluminum-containing material coated over the metal adhesion layer in a 0.1-1.2 molar concentration of acidic solution at 25° C. and applying a voltage ranging from 20V to 120V thereto.

11. The method as claimed in claim 1, wherein anodizing includes placing the substrate coated with the metal adhesion layer and the layer of aluminum-containing material coated over the metal adhesion layer is in a 0.1-20 weight percent acidic solution at 25° C. and applying a voltage ranging from 20V to 200V thereto.

12. The method as claimed in claim 1, wherein pore-widening includes placing the anodized substrate coated with the metal adhesion layer and the layer of aluminum-containing material coated over the metal adhesion layer in a 0.1-20 weight percent phosphoric acid at 10-45° C.

13. The method as claimed in claim 1, wherein the metal adhesion layer is deposited on the substrate by sputtering.

14. The method as claimed in claim 1, wherein the metal adhesion layer is deposited on the substrate by thermal evaporation.

* * * * *